(12) United States Patent
Tapie et al.

(10) Patent No.: US 8,223,806 B2
(45) Date of Patent: *Jul. 17, 2012

(54) REDUCTION IN THE ACQUISITION DURATION OF A PHASE-LOCKED LOOP ABLE TO RECONSTITUTE A SYNCHRONISATION SIGNAL TRANSMITTED OVER AN IP NETWORK

(75) Inventors: Thierry Tapie, Rennes (FR); Serge Defrance, Rennes (FR); Gael Mace, Langan (FR)

(73) Assignee: Thomson Licensing, Issy les-Moulineaux (FR)

( * ) Notice: Subject to any disclaimer, the term of this patent is extended or adjusted under 35 U.S.C. 154(b) by 338 days.

This patent is subject to a terminal disclaimer.

(21) Appl. No.: 12/733,521

(22) PCT Filed: Sep. 5, 2008

(86) PCT No.: PCT/EP2008/061757
§ 371 (c)(1),
(2), (4) Date: Mar. 5, 2010

(87) PCT Pub. No.: WO2009/030740
PCT Pub. Date: Mar. 12, 2009

(65) Prior Publication Data
US 2010/0195674 A1 Aug. 5, 2010

(30) Foreign Application Priority Data
Sep. 7, 2007 (FR) ...................................... 07 57420

(51) Int. Cl.
*H04J 3/06* (2006.01)
(52) U.S. Cl. ....................................... 370/503; 370/519

(58) Field of Classification Search .................. 370/503, 370/507, 516, 521; 709/208; 345/501, 502
See application file for complete search history.

(56) References Cited

U.S. PATENT DOCUMENTS

| 4,839,603 A | 6/1989 | Mower et al. |
| 5,128,633 A | 7/1992 | Martin et al. |
| 6,049,886 A | 4/2000 | Motoyama |
| 6,566,921 B1 | 5/2003 | Boerstler et al. |

(Continued)

FOREIGN PATENT DOCUMENTS

EP 1467488 10/2004

(Continued)

OTHER PUBLICATIONS

Search Report Dated Dec. 16, 2008.

*Primary Examiner* — Gary Mui
(74) *Attorney, Agent, or Firm* — Robert D. Shedd; Jeffrey M. Navon

(57) ABSTRACT

The present invention relates to the domain of video equipment. More specifically, it concerns a reception device that comprises the means for:
receiving packets containing samples, that come from data sampled every $T_{ech}$ period, where $T_{ech}$ is from a time base synchronized on all the stations of said network,
regenerating a counting ramp having a count increment and a range value PCR_Modulus, using a phase-locked loop $PLL_1$ that receives the samples and that delivers local samples every $T_{ech}$ period and a reconstituted clock,
initializing, at every zero-crossing of the counting ramp, an image counter that is determined by the reconstituted clock.

According to the invention, it comprises, further, means for determining the values of count increments.

8 Claims, 5 Drawing Sheets

U.S. PATENT DOCUMENTS

| | | |
|---|---|---|
| 7,271,634 B1 | 9/2007 | Daga et al. |
| 2004/0223578 A1 | 11/2004 | Lagarde |
| 2006/0261904 A1 | 11/2006 | Hanna |
| 2006/0267691 A1 | 11/2006 | Takase |
| 2007/0206712 A1 | 9/2007 | Gierl et al. |
| 2009/0175271 A1 | 7/2009 | Tapie et al. |
| 2010/0115047 A1 * | 5/2010 | Briscoe et al. ............... 709/208 |
| 2010/0315427 A1 * | 12/2010 | Wyatt et al. ............... 345/502 |

FOREIGN PATENT DOCUMENTS

| | | |
|---|---|---|
| FR | 2854751 | 11/2004 |
| GB | 2426641 | 11/2006 |
| WO | WO 2007/104891 | 9/2007 |

* cited by examiner

REDUCTION IN THE ACQUISITION DURATION OF A PHASE-LOCKED LOOP ABLE TO RECONSTITUTE A SYNCHRONISATION SIGNAL TRANSMITTED OVER AN IP NETWORK

SCOPE OF THE INVENTION

This application claims the benefit, under 35 U.S.C. §365 of International Application PCT/EP2008/061757, filed Sep. 5, 2008, which was published in accordance with PCT Article 21(2) on Mar. 12, 2009 in English and which claims the benefit of French patent application No. 07/57420, filed Sep. 7, 2007.

The present invention relates to the domain of video equipment.

The present invention relates more particularly to a device for the reception of a synchronisation signal on a packet switching network, for example of the IP type, whether the network is wired (for example Ethernet (IEEE802.3)) or wireless (for example IEEE 802.16 D-2004).

PRIOR ART

Progress in the ability of IP networks to transport all types of signal (data or video) has made it possible to use these networks as the "backbone" architecture for video studios. Of capital importance to this evolution is therefore having a single infrastructure for the transport of data. Whereas in the past, several media were necessary to transport different signal types, the multiplexing properties offered by the IP layer enable a reduction in the number of media necessary: an IP network that links the different equipment.

In the prior art, the synchronisation of items of video equipment (cameras, etc.) in a studio is carried out by the transmission of a synchronisation signal commonly called "Genlock" or "Black burst". For example, the Genlock signal comprises two synchronisation signals, one is repeated every 40 ms and indicates the start of the video frame, the other is repeated every 64 μs (for a standard format and less for an HD format) and indicates the start of lines in the video frame. The waveform of the synchronisation signals depends on the format of the image transmitted over the network. For example, for a high definition image, the signal synchronisation has a tri-level form (−300 mV, 0V, +300 mV).

When a synchronisation signal is routed to different equipment to be synchronised by a dedicated coaxial cable, a constant transmission time, without jitter is ensured. From such a signal, all items of equipment are able to reconstruct a timing clock that is specific to its functioning, which guarantees that its functioning is rigorously in phase with all the equipment connected to the same network. For example, two cameras synchronised by a Genlock signal circulating on a dedicated coaxial cable each generate a video with different contents but rigorously in frequency and in phase with one another.

A known disadvantage presented by an IP/Ethernet network is that it introduces a strong jitter in a transmission of signals, and particularly for the transmission of a synchronisation signal. When such a signal is routed by an IP/Ethernet connection to different items of equipment for synchronising, this jitter results in fluctuations in the length of time required for the information carried by the synchronisation signal to reach the equipment.

In the prior art, devices are known for reconstructing, for each camera, a timing clock specific to this camera enabling the jitter to be overcome. The underlying principle of these devices is a high attenuation of the synchronisation signal jitter amplitude at the level of reception. In such a way, it can be guaranteed that an image generated by a camera is rigorously in phase with all of the images generated by neighbouring cameras connected to the same network.

Examples of such devices are described in the international PCT application FR2007/050918, they act on program clock reference (PCR) signals that represent very accurate reference clock signals. These digital signals are sent to cameras across a network so that they can locally reconstruct clock signals that are in phase with the reference clock.

According to the prior art, the reception device comprises:
means for receiving packets containing samples of the network coming from data sampled every $T_{ech}$, period,
means for regenerating a counting ramp $CSR\_PCR_1$ using a phase-locked loop $PLL_1$,
means for initialising a second CPT counter every zero-crossing of said first counter $CSR\_PCR_1$,
means for generating image cues at every zero-crossing of the said second CPT counter, and
means for reconstituting a synchronisation signal from said image cues.

The phase-locked loop $PLL_1$ of the reception device acts as a low-pass filter that partially attenuates the jitter present in the samples received $PC_r$, that have circulated on the network.

Usually, two phases are distinguished in the functioning of the loop $PLL_1$:
a first phase, known as the "acquisition phase", during which the phase-locked loop $PLL_1$ internally produces local samples $PCR\_loc_1$ that are very different from the received samples $PCR_r$. This first phase begins with a reception of samples $PCR_r$, and ends when the local samples $PCR\_loc_1$ produced by the loop $PLL_1$ are very close to the samples received $PCP_R PCR_R$. During this functioning phase, a synchronisation signal reconstructed on the reception side by means of the loop $PLL_1$ is not in phase with the synchronisation signal on the transmission side,
a second phase, known as the "continuation phase" begins at the end of the acquisition phase and ends when a difference of reduced amplitude between the local samples $PCR\_loc_1$ and the received samples $PCR_r$, is detected. During this second functioning phase, a reconstructed synchronisation signal on the reception side is in phase with the synchronisation signal on the transmission side.

In order to quickly obtain a synchronisation of the items of equipment that are connected to a network, it therefore appears to be useful to reduce a duration of the acquisition phase.

One of the purposes of the present invention is therefore to accelerate the generation of local samples $PCR\_loc_1$ in phase with the samples received $PCR_R$. To do this, the invention proposes, in comparison with the reception devices of the prior art, to modify the generation of the counting ramp $CSR\_PCR_1$ to generate counting ramps $CSR\_PCR_1$, the increment of which, or the incrementing step ΔC, is adapted so that the difference between the local samples and the received samples is reduced as rapidly as possible. Specifically, according to the invention, the incrementing step does not necessarily have a unit value and is signed.

SUMMARY OF THE INVENTION

For this purpose, the present invention concerns a device able to receive packets in a packet switching network comprising at least two stations. The device comprises:

means for receiving packets containing samples $PCR_r$, said samples $PCR_r$ coming from data sampled every $T_{ech}$ period, where $T_{ech}$ is from a time base synchronised on all the stations of said network, means for regenerating a counting ramp $CSR\_PCR_1$ having a count increment value $\Delta C$ and a range value $PCR\_Modulus$, using a phase-locked loop $PLL_1$ receiving the samples $PCR_r$ and further delivering local samples $PCR\_loc_1$ every $T_{ech}$ period and a reconstituted clock $CLK\_out_1$ with a frequency value $F_{out}$, means for initialising, at every zero-crossing of the counting ramp $CSR\_PCR_1$, an image counter CPT that is determined by the reconstituted clock $CLK\_out_1$;

means for generating image cues at every zero-crossing of said counter CPT; and means for reconstituting a synchronisation signal from said image cues.

According to the invention, it comprises, furthermore, means $MES_1$ for determining the count increments values $\Delta C$.

An advantage of the invention lies in its faculty to shorten considerably the duration of the acquisition phase and, as a result, to reduce the duration beyond which a piece of equipment comprising a reception device according to the invention is synchronised with a transmission device emitting samples on the network. The counting ramp $CSR\_PCR_1$ is generated with a count increment $\Delta C$ that is determined from a direct or indirect measure of a difference ERR between local samples $PCR\_loc_1$ and received samples $PCR_r$.

BRIEF DESCRIPTION OF THE DRAWINGS

The invention will be better understood from the following description of an embodiment of the invention provided as an example by referring to the annexed figures, wherein.

DETAILED DESCRIPTION OF THE EMBODIMENTS OF THE INVENTION

Figure 1:
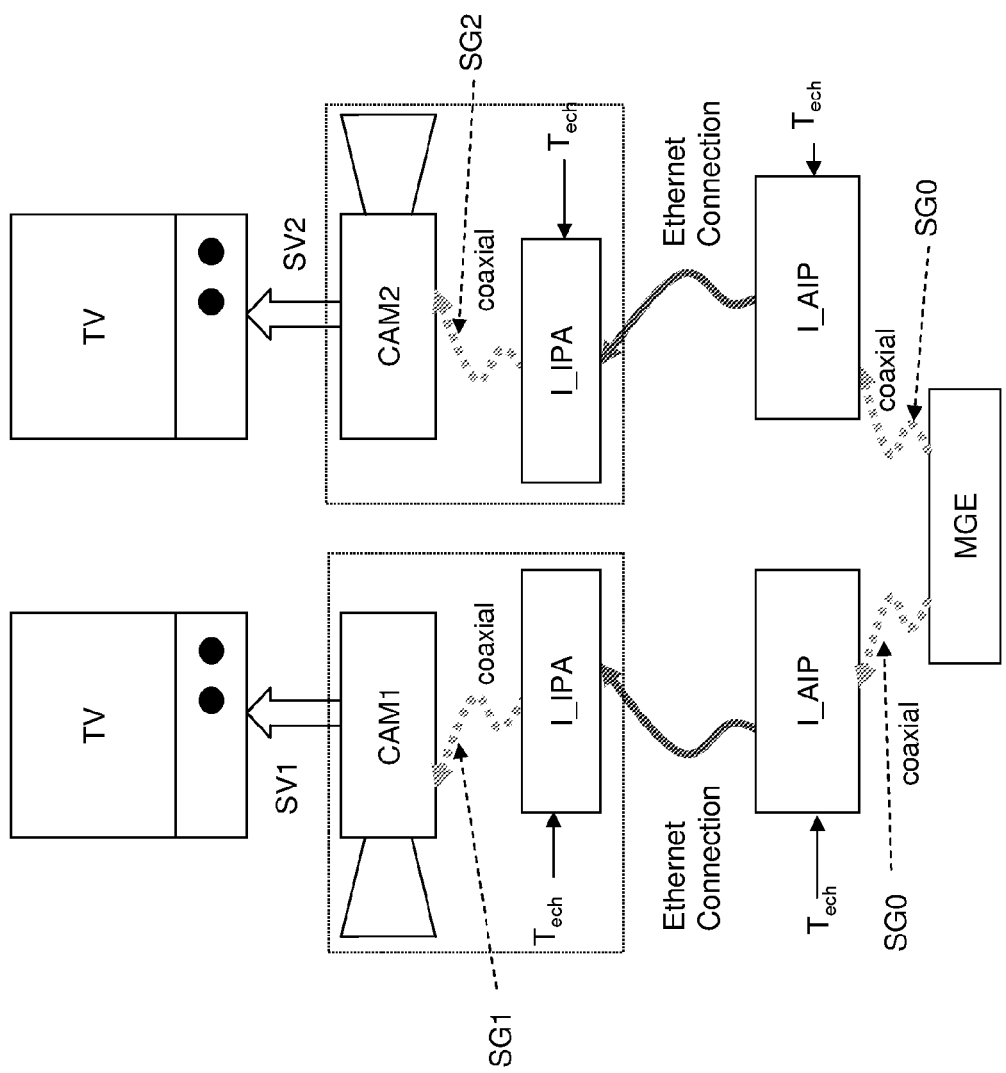
FIG. 1 shows the transmission of genlock information between two cameras linked via an IP/Ethernet network.

The current analogue domain is interfaced with the IP/Ethernet network on the transmission side, and the IP/Ethernet network is interfaced with the analogue domain on the reception side, as illustrated in FIG. 1.

In the same figure, the transmission side comprises a "Genlock master" MGE that is connected to an IP/Analogue interface IAIP. The Genlock master MGE sends a Genlock signal SG0 to the interfaces IAIP.

The reception side comprises two cameras (CAM1, CAM2) each connected to an IP/Analogue interface I_IPA. The interfaces I_IPA that will eventually be included in the cameras themselves are responsible for reconstructing the Genlock signals SG1, SG2 intended for cameras CAM1, CAM2. The cameras CAM1, CAM2 each produce a video signal SV1, SV2 that is required to be synchronised perfectly.

The transmission and reception sides are linked together by a packet switching network that is the source of a jitter occurring in the Genlock signal SG0.

A sampling pulse, in the $T_{ech}$ period, is generated from a first synchronisation layer, for example IEEE1588, and is sent to the transmission and reception sides. Indeed, the PTP protocol (Precision Time Protocol) based on IEEE1588 enables synchronisation to be obtained between the equipment connected on the Ethernet network to an order of microseconds. In other words, all the time bases of every item of equipment progress at the same time with a precision close to the order of microseconds. Each of these time bases can be used in this case to generate its own sampling pulse in the $T_{ech}$ period. Use of the IEEE1588 layer is not a required route. Any system capable of providing sampling pulses to the various items of equipment on the network in the $T_{ech}$ period could be suitable. For example, a 5 ms sampling pulse from a wireless transmission physical layer can be used.

Figure 2:
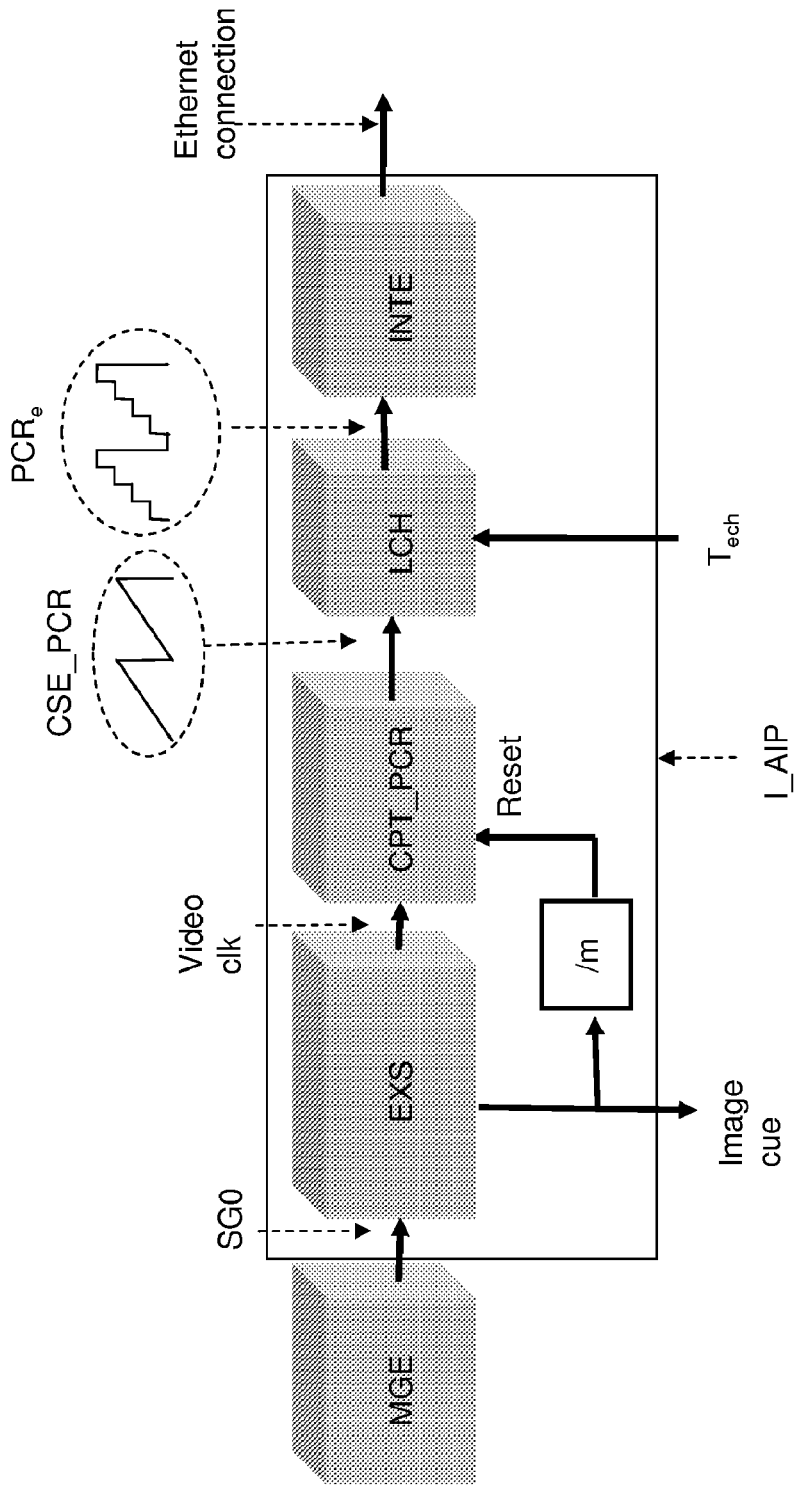
FIG. 2 shows the interfacing between the analogue domain and the IP/Ethernet network.

FIG. 2 details the processing of the Genlock signal SG0 from MGE within the interface I_AIP.

First, a module EXS extracts the synchronisation information from the signal SG0 in order to recover a video timing clock (noted as Clk on FIG. 2). More specifically, the module EXS is responsible for the generation of an image cue at the beginning of each image. Furthermore, the module EXS comprises an image counter, for example a 40 ms counter, which is not shown on FIG. 2. The output of this image counter progresses according to the counting ramp, crossing 0 at each image period, that is every 40 ms in the case of the image counter cited in the aforementioned example.

The image counter delivers a stair-step signal. The steps have a unitary height. The signal range value, that is to say the height corresponding to the difference in level between the highest step and the lowest step is equal to $40\ ms \cdot F_{out}$, where $F_{out}$ is the frequency of the video clock Clk. The counter CPT successively delivers all of the integer values from 0 to $40\ ms \cdot F_{out} - 1$.

The timing video clock is used to determine the rhythm of a counter CPT_PCR. The output of the counter CPT_PCR is a counting ramp, whose period is m image periods. Every "m" image, the counter CPT_PCR is reset, that is to say that the counting ramp CSE_PCR is reset to 0.

"Counting ramp" designates a stair-step signal whose steps have a unitary height (or count increment $\Delta C$). The signal range value, that is to say the height corresponding to the difference in level between the highest step and the lowest step is equal to $m \cdot 40\ ms \cdot F_{out}$. The counter $CPT\_PCR_1$ delivers successively all of the integer values from 0 to $m \cdot 40\ ms \cdot F_{out} - 1$.

Next, a module LCH samples the counting ramp CSE_PCR every $T_{ech}$ period to produce samples $PCR_e$. These samples $PCR_e$ are sent across the network and reach the reception side through a network interface (block INTE).

Figure 3:
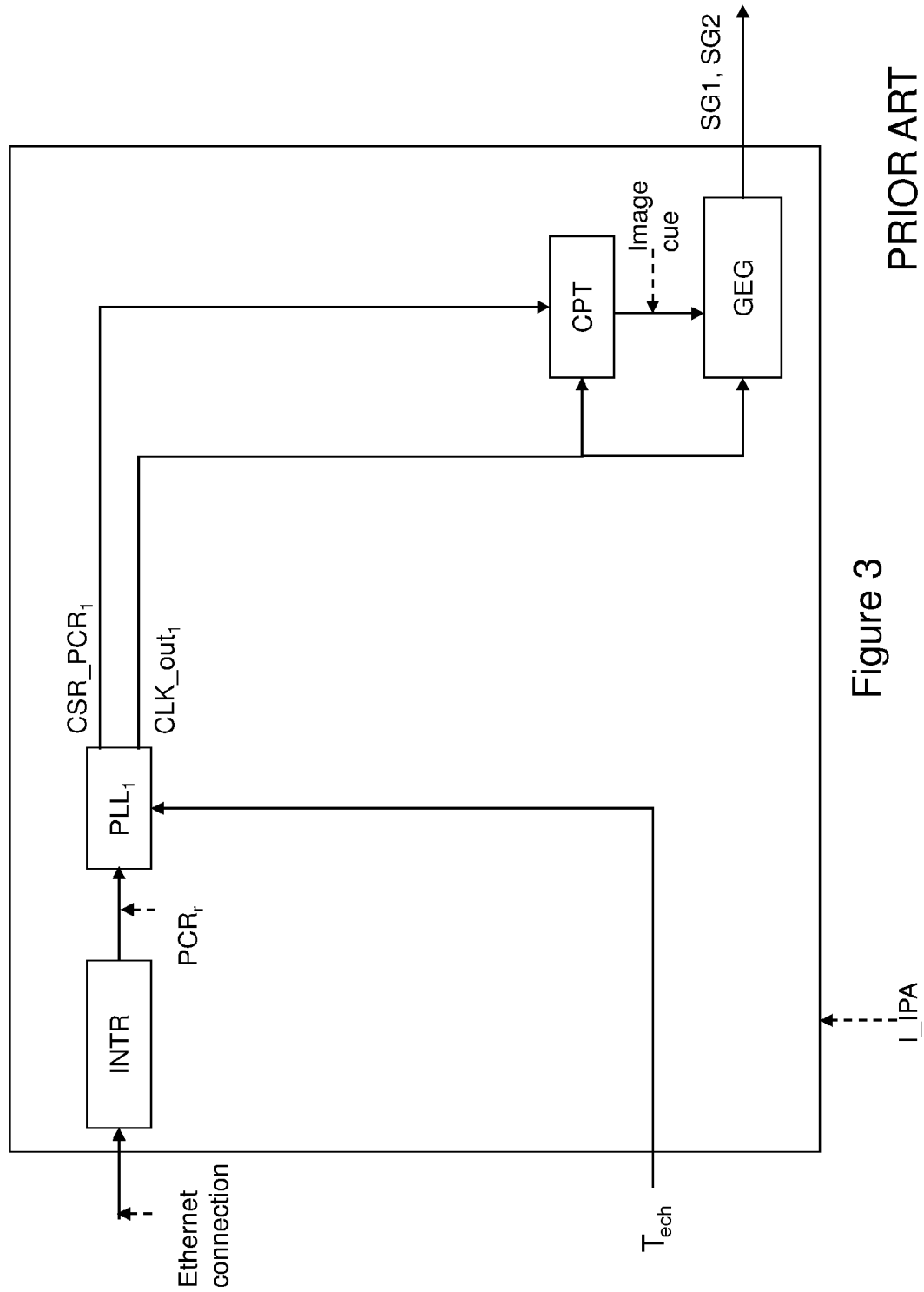
FIG. 3 shows the regeneration of the Genlock signal on the reception side according to the prior art, FIG. 4 diagrammatically shows a phase-locked loop architecture of a reception device according to the prior art, FIG. 5 diagrammatically shows a phase-locked loop architecture of a reception device according to the invention.

FIG. 3 shows the reception side according to the prior art. The interface I_IPA recovers the PCR samples that have been sent on the network. These samples $PCR_e$ are received by a network interface (module INTR) with a delay linked to the transport between the transmission device and the reception device: the module INTR produces samples $PCR_r$. The samples $PCR_e$, which are produced at regular $T_{ech}$ intervals on the transmission side, arrive at irregular intervals on the reception side: this is largely due to the jitter introduced during transport on the network. The samples $PCR_r$ are taken into account at regular $T_{ech}$ intervals and hence, the majority of the jitter introduced during packet transport is eliminated.

The imprecision between the transmission and reception sampling times is absorbed by a phase-locked loop $PLL_1$ whose bandwidth is appropriated. The characteristics of the phase-locked loop $PLL_1$ guarantee a reconstituted clock generation $CLK\_out_1$ with a reduced jitter.

The phase-locked loop $PLL_1$ acts as a system receiving $PCR_r$ samples and delivering:
- a reconstituted clock $CLK\_out_1$,
- a counting ramp $CSR\_PCR_1$ and,
- local samples $PCR\_loc_1$.

When the loop $PLL_1$ operates in a steady state, the samples $PCR_r$ are noticeably equal to the samples $PCR\_loc_1$.

The reconstituted clock $CLK\_out_1$ determines the rhythm of a CPT image counter similar to the image counter on the transmission side, for example a 40 ms counter. The image counter CPT is reset each time the counting ramp $CSR\_PCR_1$ crosses 0. Between two successive initialisations, the image counter CPT progresses freely and produces an image cue that supplies a local Genlock generator, GEG to produce a reconstituted Genlock signal SG1, SG2 designed to synchronise the cameras CAM1, CAM2.

The reconstructed Genlock signal SG1, SG2 that is generated from the counting ramp $CSR\_PCR_1$ and the reconstituted clock $CLK\_out_1$ is in phase with the Genlock signal SG0 on the transmission side, to the nearest clock pulse.

Figure 4:
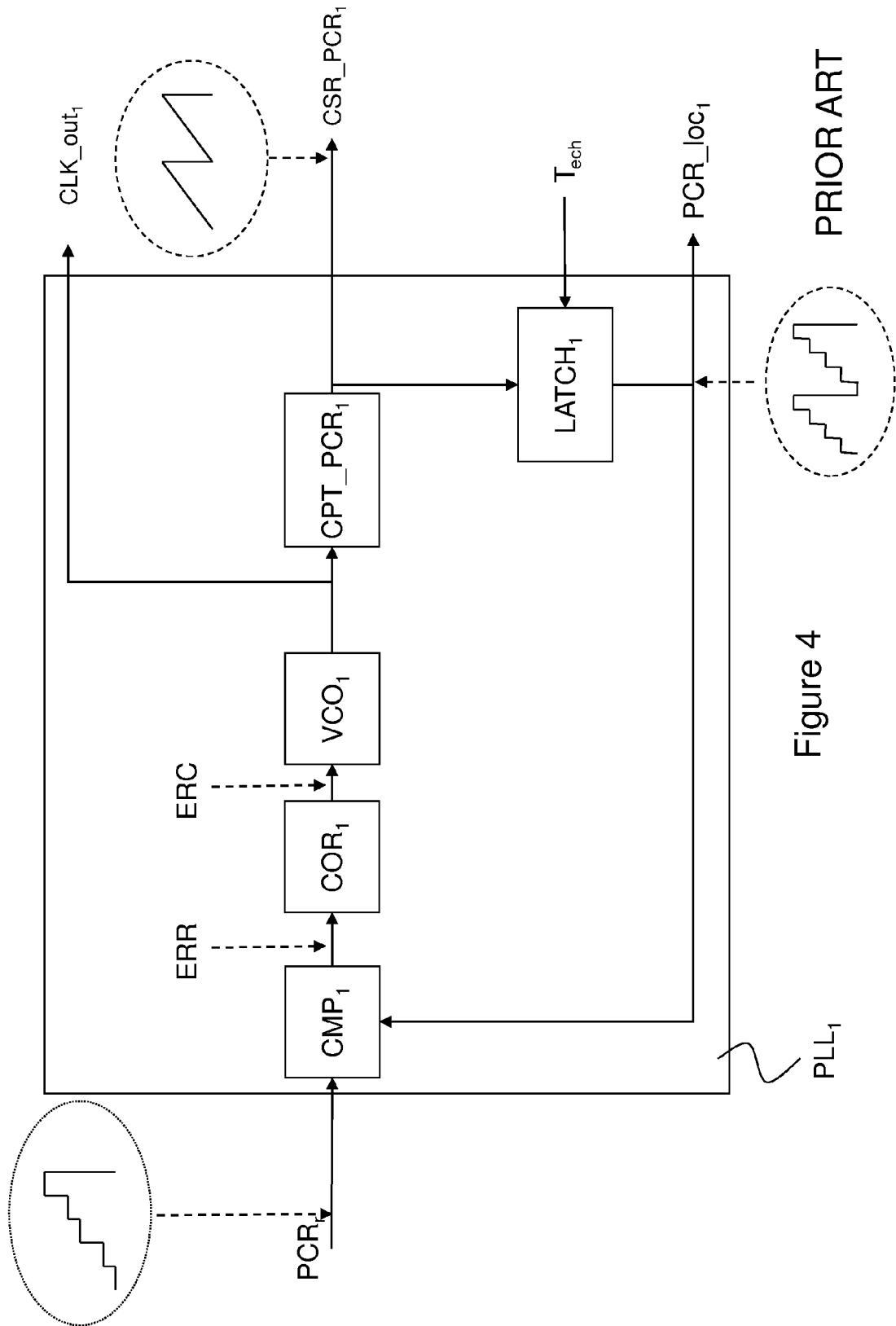

FIG. 4 diagrammatically shows a $PLL_1$ phase-locked loop architecture used in an I_IPA interface according to the prior art.

Figure 5:
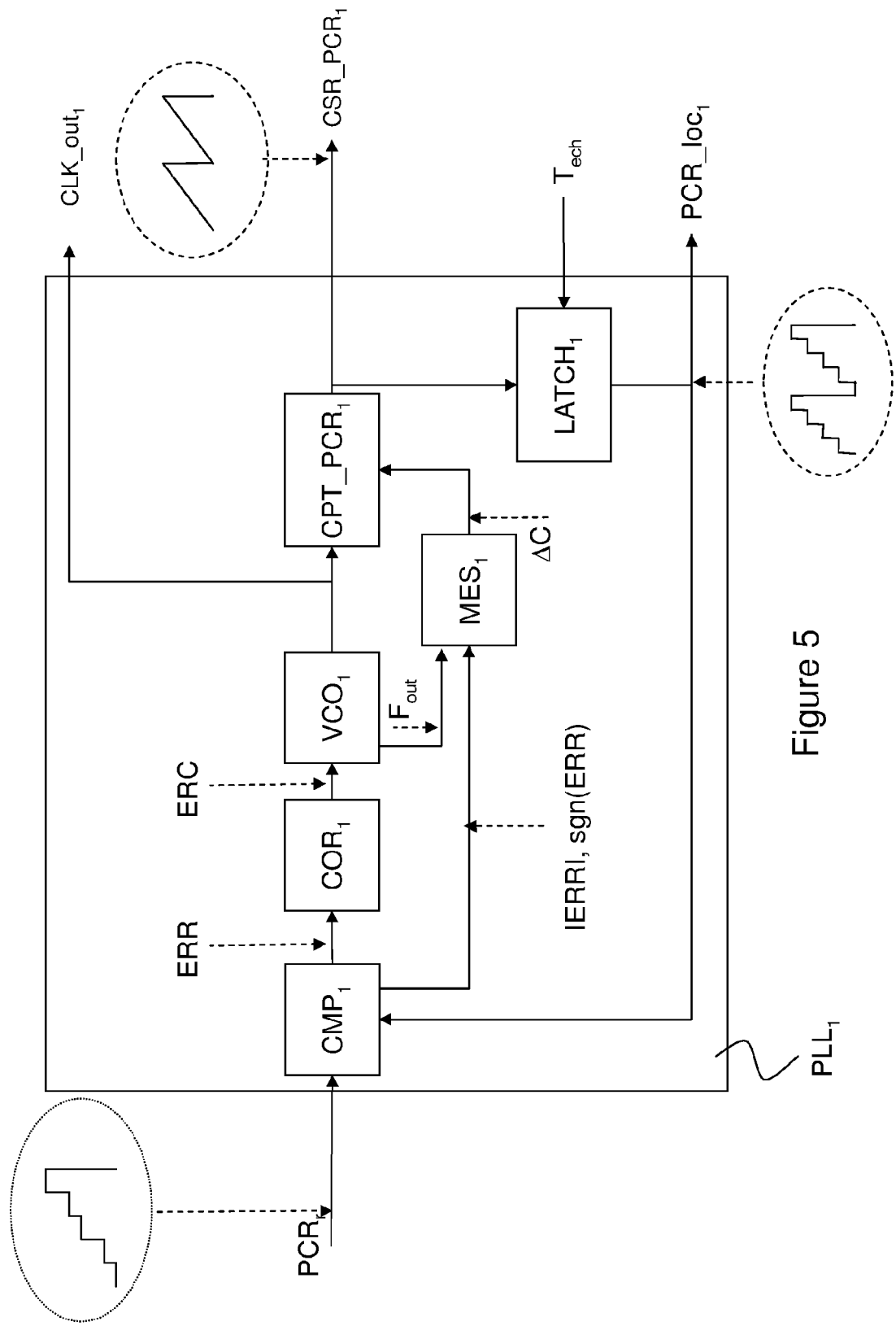

As shown in FIG. 4, the phase locking loop $PLL_1$ comprises:
- a sample comparator $CMP_1$ that compares the samples $PCR_r$ and local samples delivering a comparison result of the samples, or an error signal ERR,
- a corrector $COR_E$ receiving the signal ERR and delivering a corrected error signal ERC,
- a configurable oscillator $VCO_1$ receiving the corrected error signal ERC and delivering a reconstituted clock $CLK\_out_1$, the clock $CLK\_out_1$ has a frequency that depends on the signal ERC,
- a counter CPT_PCR1 that produces a counting ramp CSR-PCR1 according to a rate that is printed by the reconstituted clock $CLK\_out_1$,
- a support system with the value $LATCH_1$ that generates local samples $PCR\_loc_1$ from the values of the counting ramp $CSR\_PCR_1$ at the times $T_{ech}$, FIG. 5 illustrates a sample locking loop $PLL_1$ of a reception device $PLL_1$ according to the invention. The loop $PLL_1$ comprises the means $MES_1$ for determining the incrementing step $\Delta C$.

Hereafter, it is considered that a counting ramp having value range value E, takes successively all the integer values between 0 and E−1.

A pulse from the reconstituted clock $CLK\_out_1$ is identified uniquely by an index i. The pulse i+1 follows chronologically the pulse i.

The counter CPT_PCR$_1$ receives a count increment value $\Delta C$ and uses it to produce the counting ramp values $CSR\_PCR_1$. A counting ramp value with the index i+1 is deduced from a counting ramp value with the index i by a difference whose value is the count increment $\Delta C$.

Advantageously, the count increment values $\Delta C$ are integers and signed.

Advantageously, the count increment values $\Delta C$ are determined from the frequency value $F_{out}$ of the reconstituted clock $CLK\_out_1$.

Advantageously, a count increment value $\Delta C$ has an absolute value that is a function of the frequency value $F_{out}$ of the reconstituted clock $CLK\_out_1$.

Advantageously, a count increment $\Delta C$ has a sign that is a function of the frequency value $F_{out}$ of the reconstituted clock $CLK\_out_1$.

Advantageously, the count increment values $\Delta C$ are determined the amplitude of the difference values (ERR), referred as |ERR| on drawings, and sign of the difference values (ERR), referred as sgn(ERR) on drawings.

Advantageously, a count increment $\Delta C$ has a sign that is a function of the sign of the difference values ERR.

Advantageously, a count increment $\Delta C$ has an absolute value that is a function of the amplitude of the difference ERR.

The invention is described in the preceding text as an example. It is understood that those skilled in the art are capable of producing variants of the invention without leaving the scope of the patent.

The invention claimed is:

1. Reception device able to receive packets in a packet switching network comprising at least two stations, said device comprising:
- means for receiving packets containing samples, said samples coming from data sampled every period, where the period is from a time base synchronised on all the stations of said network,
- means for regenerating a counting ramp having a count increment value and a range value PCR_Modulus, using a phase-locked loop receiving the samples and further delivering local samples every $T_{ech}$ period and a reconstituted clock with a frequency value $F_{out}$,
- means for initialising, at every zero-crossing of the counting ramp, an image counter that is determined by the reconstituted clock,
- means for generating image cues at every zero-crossing of said counter, and
- means for reconstituting a synchronization signal from said image cues, wherein the device comprises, further, means for determining the count increments values.

2. Reception device according to claim 1, wherein the count increment values are integers and signed.

3. Reception device according to claim 2, wherein the count increment values are determined from the frequency value $F_{out}$ of the reconstituted clock.

4. Reception device according to claim 3, wherein a count increment value has an absolute value that is a function of the frequency value $F_{out}$ the reconstituted clock.

5. Reception device according to claim 3, wherein a count increment value has a sign that is a function of the frequency value $F_{out}$ of the reconstituted clock.

6. Reception device according to claim 2, difference values between local samples and samples being calculated, wherein the count increment values are determined from the amplitude of the difference values and sign of the difference values.

7. Reception device according claim 6, wherein the count increment has a sign that is a function of the sign of difference values.

8. Reception device according claim 6, wherein a count increment has an absolute value that is a function of amplitude of the difference values.

* * * * *